(12) United States Patent
Hu et al.

(10) Patent No.: US 9,502,441 B2
(45) Date of Patent: Nov. 22, 2016

(54) ARRAY SUBSTRATE WITH CONNECTING LEADS AND MANUFACTURING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Haichen Hu, Beijing (CN); Yusheng Xi, Beijing (CN); Jiarong Liu, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 0 days.

(21) Appl. No.: 14/406,950

(22) PCT Filed: May 27, 2014

(86) PCT No.: PCT/CN2014/078543
§ 371 (c)(1),
(2) Date: Dec. 10, 2014

(87) PCT Pub. No.: WO2015/090004
PCT Pub. Date: Jun. 25, 2015

(65) Prior Publication Data
US 2015/0325601 A1    Nov. 12, 2015

(30) Foreign Application Priority Data
Dec. 18, 2013    (CN) .......................... 2013 1 0701251

(51) Int. Cl.
*H01L 29/04*    (2006.01)
*H01L 27/12*    (2006.01)
(Continued)

(52) U.S. Cl.
CPC ....... *H01L 27/1244* (2013.01); *G02F 1/13458* (2013.01); *H01L 27/127* (2013.01); *H01L 27/1262* (2013.01); *G02F 2001/136254* (2013.01); *H01L 27/124* (2013.01)

(58) Field of Classification Search
CPC ................... H01L 21/6835; H01L 21/76898; H01L 23/481; H01L 24/08; H01L 24/24; H01L 24/29; H01L 24/73; H01L 24/83; H01L 27/1214; H01L 27/1266; H01L 27/14618; H01L 31/0203; H01L 27/1244; H01L 27/127; H01L 27/1262; H01L 27/124
USPC ........................................... 257/59, 72, 620
See application file for complete search history.

(56) References Cited

U.S. PATENT DOCUMENTS 8,098,341 B2    1/2012    Chung et al.
8,178,878 B2    5/2012    Chien et al.
(Continued)

FOREIGN PATENT DOCUMENTS

| CN | 1573483 A | 2/2005 |
|---|---|---|
| CN | 101252136 A | 8/2008 |
| CN | 101359669 A | 2/2009 |
| CN | 101599496 A | 12/2009 |
| CN | 103698952 A | 4/2014 |

OTHER PUBLICATIONS

First Office Action issued by the Chinese Patent Office for Chinese Patent Application No. CN201310701251.8 that was issued on Sep. 30, 2015 in Chinese with an English translation.
(Continued)

*Primary Examiner* — Dung Le
(74) *Attorney, Agent, or Firm* — Collard & Roe, P.C.

(57) ABSTRACT

An array substrate with connecting leads and a manufacturing method thereof are provided. The array substrate includes a substrate; a plurality of signal lines formed of a metal layer, which are disconnected at a cut zone of the substrate; a plurality of connecting leads disposed in an adjacent layer of the signal lines, which correspond to locations of the signal lines where they are disconnected, and directly contact with the signal lines; wherein, two ends of each of the signal lines in its disconnected position are electrically joined by the connecting leads, and the signal lines include gate lines, the connecting leads include first leads; wherein, the first leads are formed on the substrate, and the gate lines are located in an upper level than the first leads.

8 Claims, 5 Drawing Sheets

(51) Int. Cl.
*G02F 1/1345* (2006.01)
*G02F 1/1362* (2006.01)

(56) References Cited

U.S. PATENT DOCUMENTS

| | | | |
|---|---|---|---|
| 2003/0111706 A1* | 6/2003 | Lee | H01L 27/0805 257/500 |
| 2003/0117536 A1 | 6/2003 | Jeon | |
| 2004/0238888 A1 | 12/2004 | Yasuda et al. | |
| 2012/0133870 A1 | 5/2012 | Park | |
| 2013/0153277 A1* | 6/2013 | Menard | H01L 21/6835 174/260 |

OTHER PUBLICATIONS

International Search Report, International Preliminary Report on Patentability and Written Opinion of the International Searching Authority of PCT/CN2014/078543 in Chinese, mailed Aug. 27, 2014.

Second Chinese Office Action in Chinese Application No. 201310701251.8 mailed Jan. 5, 2016 with English translation.

English translation of the International Preliminary Report on Patentability and Written Opinion of the International Searching Authority of PCT/CN2014/078543, issued Jun. 21, 2016.

* cited by examiner

ARRAY SUBSTRATE WITH CONNECTING LEADS AND MANUFACTURING METHOD THEREOF

CROSS REFERENCE TO RELATED APPLICATIONS

This application is the National Stage of PCT/CN2014/078543 filed on May 27, 2014, which claims priority under 35 U.S.C. §119 of Chinese Application No. 201310701251.8 filed on Dec. 18, 2013, the disclosure of which is incorporated by reference.

TECHNICAL FIELD

Embodiments of the present invention relate to an array substrate and a manufacturing method thereof.

BACKGROUND

Among flat panel display technologies, Thin Film Transistor (TFT) Liquid Crystal Displays (LCDs) have the traits of low power consumption, relatively low manufacturing cost and being irradiation-free, and thus play a leading role in the market for flat panel displays. In a peripheral portion of the TFT array substrate surroundings its portion to be cell-assembled with a color filter substrate, there is provided a Lead Pad zone. The Lead Pad zone mainly acts to add test signals for detection of electrical properties in the course of manufacturing the array substrate.

In general, a manufacturing process of the array substrate is divided into steps of, forming a gate metal layer, which includes a gate electrode and a gate line; forming a gate insulating layer and an amorphous silicon semiconductor layer; forming a source/drain metal layer, which includes a source electrode, a drain electrode and a data line; forming a passivation layer; forming a pixel electrode.

In the above process, as an integral, uninterrupted lead design structure is adopted at the Lead Pad zone, damage will be brought about to metal layers and an insulating layer when a cutting process is conducted on the array substrate, thereby generating tiny cracks. Therefore, with infiltration of water vapor and so on during use, the phenomenon that metals of the gate metal layer and the source/drain metal layer are corroded may occur.

SUMMARY

According to embodiments of the present invention, there is provided an array substrate, comprising:
a substrate;
a plurality of signal lines formed by a metal layer, which are disconnected at a cut zone of the substrate;
a plurality of connecting leads disposed in an adjacent layer of the signal lines, which correspond to locations of the signal lines where they are disconnected, and directly contact with the signal lines;
wherein, two ends of each of the signal lines in its disconnected position are electrically joined by the connecting leads.

In the embodiment of the invention, a connecting lead is provided in an adjacent layer of a signal line, and two ends of the signal line in a disconnected position are joined by the connecting lead, so as to avoid an issue that metal is easy to be corroded after the array substrate is cut.

In an example, the signal lines include gate lines, the connecting leads include first leads;

wherein, the first leads are formed on the substrate, and the gate lines are located in an upper level than the first leads. In the embodiment, the first leads and the gate lines are disposed in two adjacent layers, so as to achieve direct contact of the first leads with the gate lines and to avoid use of a via-hole process. Thus, the complexity degree of process is reduced.

In an example, the signal lines further include data lines, the connecting leads further include second leads;
structure of the array substrate further includes a gate insulating layer, the second leads are formed on the gate insulating layer, and the data lines are located in an upper level than the second leads. In the embodiment, the second leads and the data lines are disposed in two adjacent layers, so as to achieve direct contact of the second leads with the data lines and to avoid use of a via-hole process. Thus, the complexity degree of process is reduced.

In an example, the signal lines include gate lines, the connecting leads include first leads;
structure of the array substrate further includes a gate insulating layer, the first leads are formed on the gate insulating layer, and the gate lines are located in an upper level than the first leads. In the embodiment, the first leads and the gate lines are disposed in two adjacent layers, so as to achieve direct contact of the first leads with the gate lines and to avoid use of a via-hole process. Thus, the complexity degree of process is reduced.

In an example, the signal lines further include data lines, the connecting leads further include second leads;
wherein, the second leads are formed on the substrate, the data lines are located in an upper level than the second leads, and the gate insulating layer is formed on the data lines. In the embodiment, the second leads and the data lines are disposed in two adjacent layers, so as to achieve direct contact of the second leads with the data lines and to avoid use of a via-hole process. Thus, the complexity degree of process is reduced.

In an example, it further includes a plurality of common electrodes, and the first leads and the common electrodes are provided on a same layer. In the embodiment, the first leads and the common electrodes are provided on the same layer, so as to decrease the manufacturing procedures and to reduce the cost.

In an example, material for the connecting leads is a conductive oxide, such as, indium tin oxide, indium zinc oxide or aluminum zinc oxide. In the embodiment, connecting leads are made of an inert material, so as to improve the corrosion-resistant property.

The embodiment of the invention has the following beneficial effects: a connecting lead formed of an inert material is provided in an adjacent layer of a gate line or/and a data line, and two ends of the gate line or/and data lines in a disconnected position are joined by the connecting lead, so as to avoid an issue that metal is easy to be corroded after the array substrate is cut.

According to an embodiment of the invention, there is provided a manufacturing method of an array substrate, comprising:
forming a first conductive thin film on a substrate, so as to form a plurality of first leads and a plurality of common electrodes through a patterning process;
forming a first metal thin film, so as to form a gate electrode and a plurality of gate lines through a patterning process, the gate lines being disconnected at a cut zone of the substrate, and being electrically joined by the first leads.

In an example, the manufacturing method further includes:

forming a gate insulating layer;

forming a second conductive thin film, so as to form a plurality of second leads through a patterning process;

forming a second metal thin film, so as to form a source electrode, a drain electrode and a plurality of data lines through a patterning process, the data lines being disconnected at a cut zone of the substrate, and being electrically joined by the second leads;

forming an active layer thin film, so as to form an active layer through a patterning process;

forming a passivation layer thin film, so as to form a passivation layer through a patterning process.

The embodiment of the invention has the following beneficial effects: a connecting lead formed of an inert material is provided in an adjacent layer of a gate line or/and a data line, and two ends of the gate line or/and data lines in a disconnected position are joined by the connecting lead, so as to avoid an issue that metal is easy to be corroded after the array substrate is cut.

According to an embodiment of the invention, there is provided a manufacturing method of an array substrate, comprising:

forming a second conductive thin film on a substrate, so as to form a plurality of second leads and a plurality of pixel electrodes through a patterning process;

forming a second metal thin film, so as to form a source electrode, a drain electrode and a plurality of data lines through a patterning process, the data lines being disconnected at a cut zone of the substrate, and being electrically joined by the second leads.

In an example, the manufacturing method further includes:

forming an active layer thin film, so as to form an active layer through a patterning process;

forming a gate insulating layer thin film, so as to form a gate insulating layer through a patterning process;

forming a first conductive thin film, so as to form a plurality of first leads and a plurality of common electrodes through a patterning process;

forming a first metal thin film, so as to form a gate electrode and a plurality of gate lines through a patterning process, the gate lines being disconnected at a cut zone of the substrate, and being electrically joined by the first leads;

forming a passivation layer thin film, so as to form a passivation layer through a patterning process.

In an example, material for at least one of the first leads and the second leads is a conductive oxide.

The embodiment of the invention has the following beneficial effects: a connecting lead formed of an inert material is provided in an adjacent layer of a gate line or/and a data line, and two ends of the gate line or/and data lines in a disconnected position are joined by the connecting lead, so as to avoid an issue that metal is easy to be corroded after the array substrate is cut.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
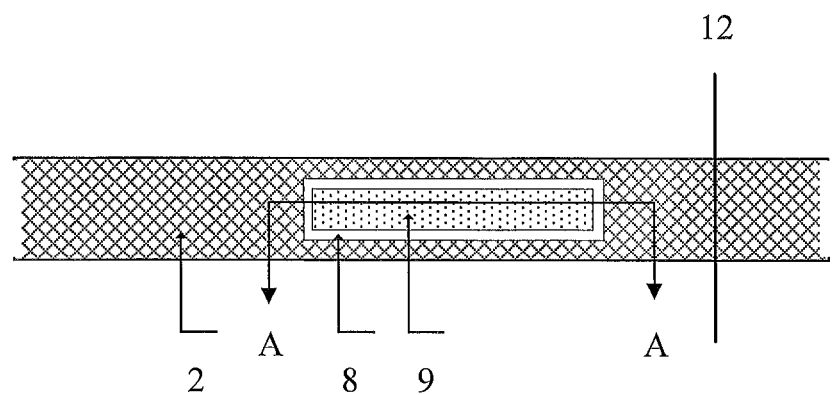
FIG. 1 is a structurally schematic top-view illustrating a gate line at a Lead Pad zone of an array substrate.
Figure 2:
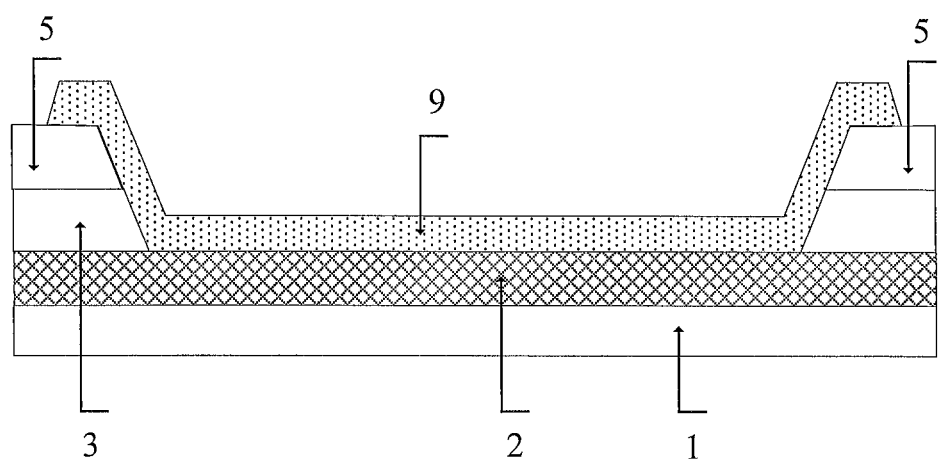
FIG. 2 is a schematically cross-sectional view illustrating a section A-A in FIG. 1.
Figure 3:
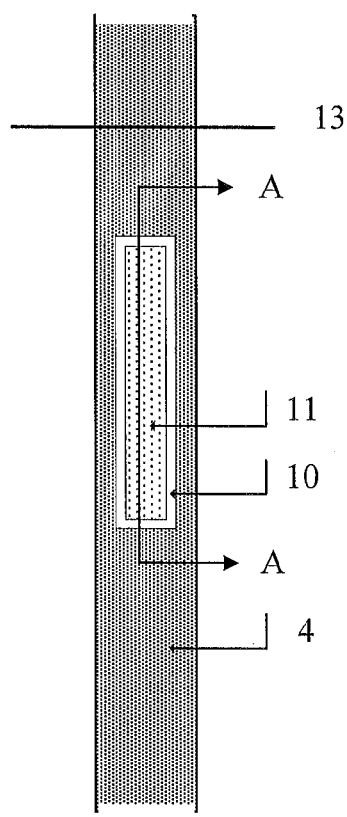
FIG. 3 is a structurally schematic top-view illustrating a data line at a Lead Pad zone of an array substrate.
Figure 4:
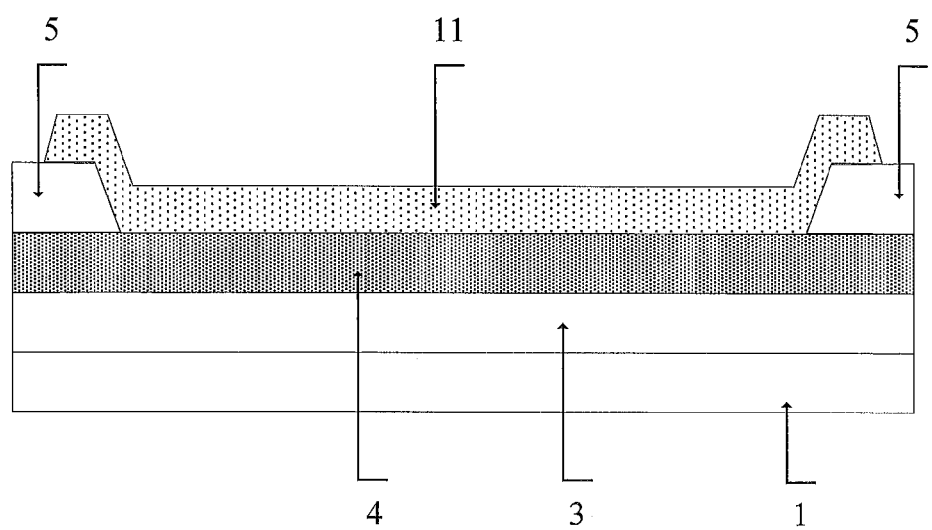
FIG. 4 is a schematically cross-sectional view illustrating a section A-A in FIG. 3.

FIG. 1 and FIG. 2 are the structural design of a Lead Pad zone corresponding to a gate line of a TFT array substrate and its schematically sectional view at the section A-A. As illustrated in FIG. 1, the gate-line Lead Pad structure includes a substrate 1, a gate line 2, at least one via hole 8 (only one via hole 8 is illustrated in FIG. 1) and a test pad 9, wherein, a reference numeral 12 denotes a cutting place of the array substrate. As illustrated in FIG. 2, a gate insulating layer 3 covers the gate line 2, a passivation layer 5 covers the individual parts as stated above. The test pad 9 is connected to the gate line 2 through the via hole 8 of the gate insulating layer 3 and the passivation layer 5. FIG. 3 and FIG. 4 are the structural design of a Lead Pad zone corresponding to a data line of a current mainstream array substrate and its schematically sectional view at the section A-A. As illustrated in FIG. 3, the data-line Lead Pad structure includes a substrate 1, a data line 4, at least one via hole 10 (only one via hole 10 is illustrated in FIG. 3) and a test pad 11, wherein, a reference numeral 13 denotes a cutting place of the array substrate. As illustrated in FIG. 4, the data line 4 is disposed between a gate insulating layer 3 and a passivation layer 5, and the passivation layer 5 covers the individual parts as stated above. The test pad 11 is connected to the data line 4 through the via hole 10 of the passivation layer 5.

According to an embodiment of the invention, there is provided an array substrate, comprising:

a substrate;

a plurality of signal lines formed by a metal layer, which are disconnected at a cut zone of the substrate;

a plurality of connecting leads disposed in an adjacent layer of the signal lines, which correspond to locations of the signal lines where they are disconnected, and directly contact with the signal lines;

wherein, two ends of each of the signal lines in its disconnected position are electrically joined by the connecting leads.

In the embodiment of the invention, a connecting lead is provided in an adjacent layer of a signal line, and two ends of the signal line in a disconnected position are joined by the connecting lead, so as to avoid an issue that metal is easy to be corroded after the array substrate is cut.

Descriptions will be given below with reference to an example in which signal lines are gate lines and/or data lines.

For example, the signal lines include gate lines, the connecting leads include first leads; wherein, the first leads are formed over the substrate, and the gate lines are located in an upper level than the first leads. The structure is generally used in an array substrate have a bottom-gate structure, the gate lines are disconnected at a cut zone of the substrate, and two disconnected ends of a gate line are electrically joined by a first lead. In the embodiment, the first leads and the gate lines are disposed in two adjacent layers, so as to achieve direct contact of the first leads with the gate lines and to avoid use of a via-hole process. Thus, the complexity degree of process is reduced.

In an example, the signal lines further include data lines, the connecting leads further include second leads; structure of the array substrate further includes a gate insulating layer, the second leads are formed over the gate insulating layer, and the data lines are located in an upper level than the second leads. The structure is used in an array substrate have a bottom-gate structure as well, the data lines are disconnected at a cut zone of the substrate, and two disconnected ends of a data line are electrically joined by a second lead. In the embodiment, the second leads and the data lines are disposed in two adjacent layers, so as to achieve direct contact of the second leads with the data lines and to avoid use of a via-hole process. Thus, the complexity degree of process is reduced.

In the embodiment, the array substrate further includes a plurality of common electrodes, and the first leads and the common electrodes are provided on the same layer. The manufacturing procedures are decreased and the cost is reduced by means of providing the first leads and the common electrodes on the same layer. Of course, not all of the array substrate architectures are suitable for the case where first leads and common electrodes are provided on the same layer, and the array substrate architecture of bottom-gate mode provided by the embodiment is merely an exemplary scheme. The first leads may also be provided by a separate process, so as to fit various array substrate architectures.

For another example, the signal lines include gate lines, the connecting leads include first leads; structure of the array substrate further includes a gate insulating layer, the first leads are formed over the gate insulating layer, and the gate lines are located in an upper level than the first leads. The structure is generally used in an array substrate have a top-gate structure, the gate lines are disconnected at a cut zone of the substrate, and two disconnected ends of a gate line are electrically joined by a first lead. In the embodiment, the first leads and the gate lines are disposed in two adjacent layers, so as to achieve direct contact of the first leads with the gate lines and to avoid use of a via-hole process. Thus, the complexity degree of process is reduced, and the resistance is decreased as well.

In an example, the signal lines further include data lines, the connecting leads further include second leads; wherein, the second leads are formed over the substrate, the data lines are located in an upper level than the second leads, and the gate insulating layer is formed over the data lines. The structure is also used in an array substrate have a top-gate structure, the data lines are disconnected at a cut zone of the substrate, and two disconnected ends of a data line are electrically joined by a second lead. In the embodiment, the second leads and the data lines are disposed in two adjacent layers, so as to achieve direct contact of the second leads with the data lines and to avoid use of a via-hole process. Thus, the complexity degree of process is reduced, and the resistance is decreased as well.

Array substrates of the above embodiments have been described with gate lines and data lines for bottom-gate and top-gate as examples, respectively. Certainly, the architecture of array substrate in the embodiment is merely for explanation of the invention, and the invention is also applied to other array substrate, and is not limited thereto. Furthermore, it shall be noted that, the array substrate provided by the invention does not refer to an array substrate for display, but an array substrate structure in which a plurality of array substrates for display are formed on a base substrate and have not been cut.

For example, substance for the connecting leads is indium tin oxide, indium zinc oxide or aluminum zinc oxide. In the embodiment, the connecting leads are made of an inert material, so as to improve the corrosion-resistant property.

The embodiment of the invention has the following beneficial effects: a connecting lead formed of an inert material is provided in an adjacent layer of a gate line or/and a data line, and two ends of the gate line or/and data lines in a disconnected position are joined by the connecting lead, so as to avoid an issue that metal is easy to be corroded after the array substrate is cut.

For ease of understanding, the structure of an array substrate in which signal lines are gate lines or data lines will be described in conjunction with accompanied drawings.

Figure 5:
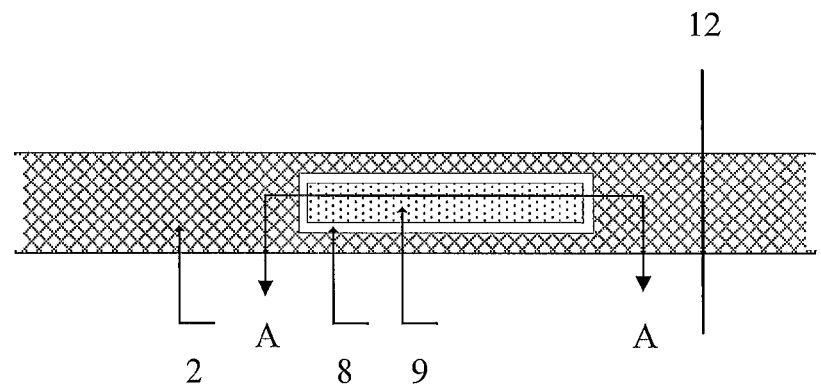
FIG. 5 is a structurally schematic top-view illustrating a gate line at a Lead Pad zone of an array substrate provided by an embodiment of the invention.

Referring to FIG. 5, an array substrate is provided by an embodiment of the invention. FIG. 5 is a structurally schematic top-view illustrating a gate line at a Lead Pad zone of the array substrate, and for clarity of the figure, only a gate line 2 having a multilayer structure, a via hole 8 and a test pad 9 of the array substrate are illustrated in FIG. 5. The gate line 2 is disconnected in a cutting place 12 of the array substrate.

Figure 6:
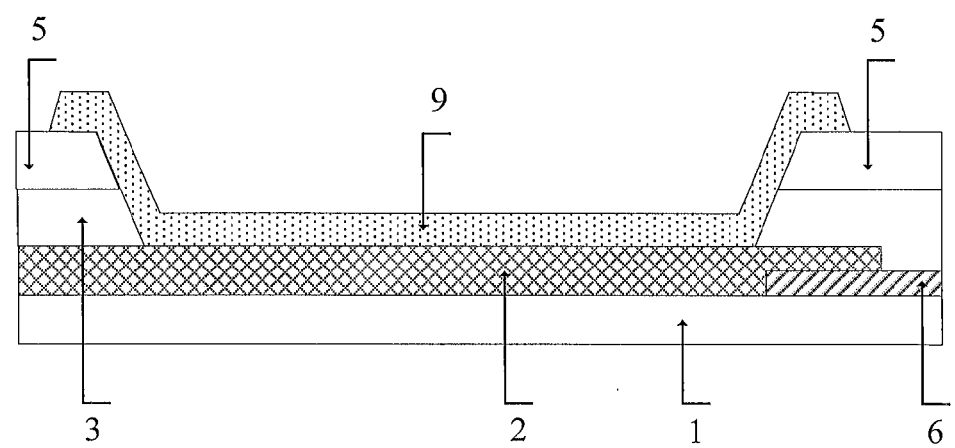
FIG. 6 is a schematically cross-sectional view illustrating a section A-A in FIG. 5.

FIG. 6 is a schematically sectional view at the A-A location illustrated in FIG. 5, in which, a substrate 1, and a gate line 2 over the substrate 1, a gate insulating layer 3 and a passivation layer 5 over the gate line 2 are included. At least one end of the gate line 2 in a disconnected position is connected to the test pad 9 through the via hole 8; a first lead 6 is provided between the gate line 2 and the substrate 1, so that two ends of the gate line 2 in the disconnected position are joined with the aid of the first lead 6. For example, the first lead 6 illustrated in FIG. 6 is disposed in a place corresponding to the disconnected position of the gate line 2, and is capable of joining two ends of the gate line 2 in the disconnected position. As two ends of the gate line 2 in the disconnected position are joined with the aid of the first lead 6 in direct contact with the gate line 2, there is a smaller resistance at the joint. Certainly, in addition to the place corresponding to the disconnected position of the gate line 2, a first lead 6 may also be disposed underlying the whole gate line 2.

Figure 7:
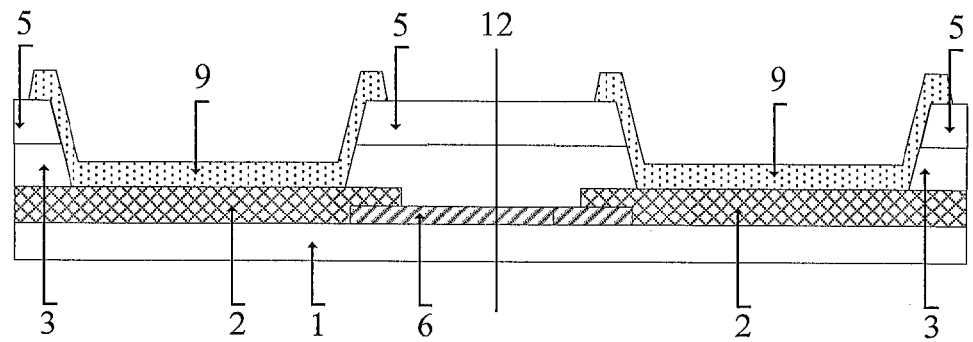
FIG. 7 is a schematically sectional view illustrating an array substrate provided by an embodiment of the invention, in which two ends of a gate line illustrated in a Lead Pad zone in its disconnected position are joined together.

Referring to FIG. 7, a schematically section view in which two ends of a gate line 2 in a disconnected position are joined together is illustrated. The meaning of each reference numeral is the same as that in FIG. 5 and FIG. 6. FIG. 7 clearly illustrates two ends of the gate line 2 in the disconnected position, and it illustrates that the two ends are joined with the aid of a first lead 6.

Figure 8:
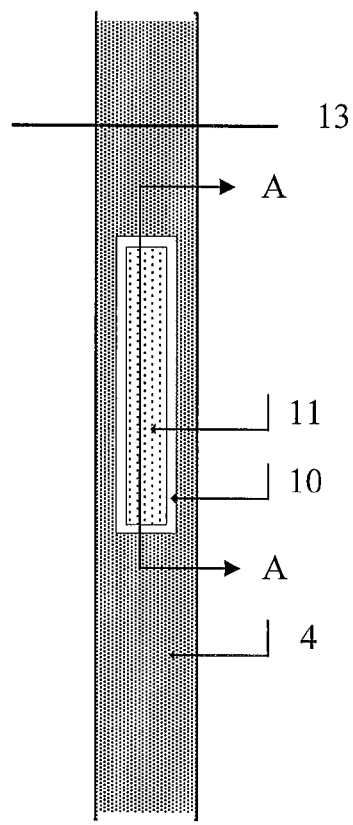
FIG. 8 is a structurally schematic top-view illustrating a data line at a Lead Pad zone of an array substrate provided by an embodiment of the invention.

Referring to FIG. 8, a structurally schematic top-view illustrating a data line at a Lead Pad zone of the array substrate is illustrated. For clarity of the figure, only a data line 4 having a multilayer structure, a via hole 10 and a test pad 11 of the array substrate are illustrated in FIG. 8. The data line 4 is disconnected in a cutting plate 13 of the array substrate.

Figure 9:
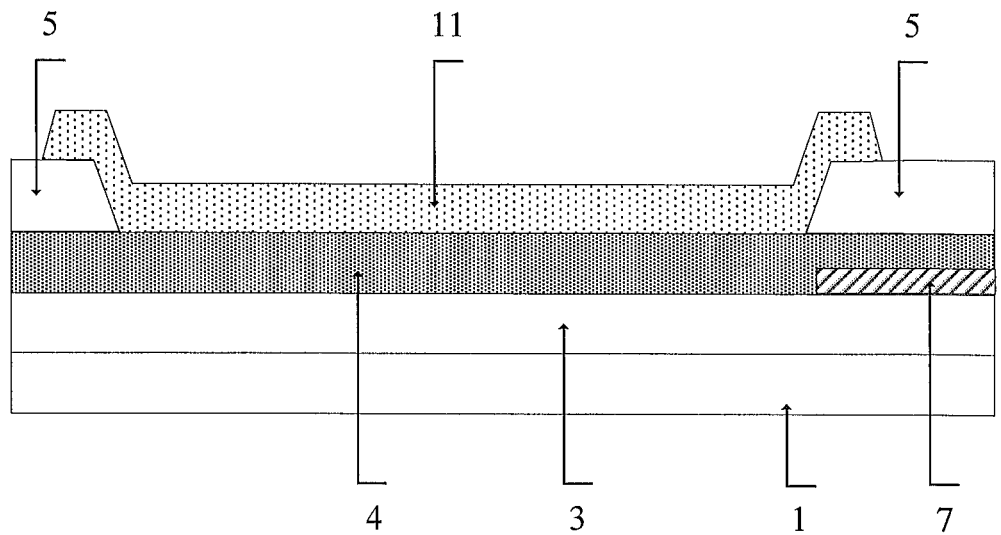
FIG. 9 is a schematically cross-sectional view illustrating a section A-A in FIG. 8.
Figure 10:
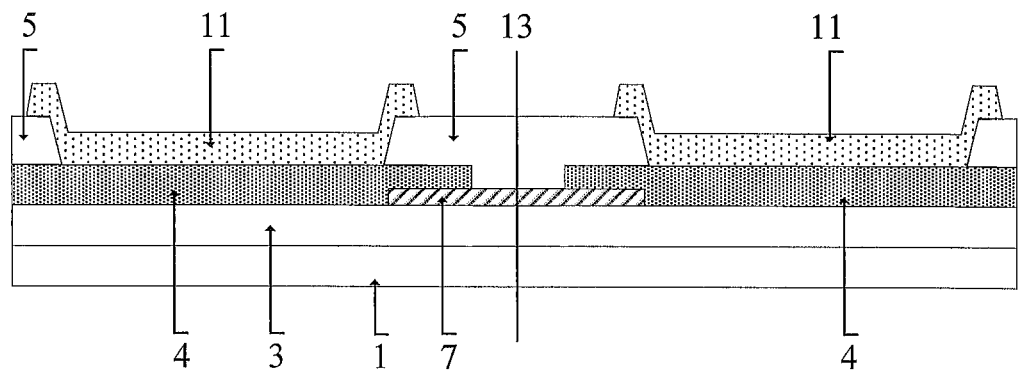
FIG. 10 is a schematically sectional view illustrating an array substrate provided by an embodiment of the invention, in which two ends of a data line illustrated in a Lead Pad zone in its disconnected position are joined together.

FIG. 9 is a schematically sectional view at the A-A location illustrated in FIG. 8, in which, a substrate 1, and a gate insulating layer 3 over the substrate 1, a data line 4 over the gate insulating layer 3 and a passivation layer 5 over the data line 4 are included. At least one end of the data line 4 in a disconnected position is connected to the test pad 11 through the via hole 10; a second lead 7 is provided between the data line 4 and the gate insulating layer 3, so that two ends of the data line 4 in the disconnected position are joined with the aid of the second lead 7. For example, the second lead 7 illustrated in FIG. 9 is disposed in a place corresponding to the disconnected position of the data line 4, and is capable of joining the disconnected places of the data line 4. As two ends of the data line 4 in the disconnected position are joined with the aid of the second lead 7 in direct contact with the data line 4, there is a smaller resistance at the joint. Certainly, in addition to the place corresponding to the disconnected position of the data line 4, a second lead 7 may also be disposed underlying the whole data line 4. Referring to FIG. 10, a schematically section view in which two ends of a data line 4 in a disconnected position are joined together is illustrated. The meaning of each reference numeral is the same as that in FIG. 8 and FIG. 9. Two ends of the data line 4 in the disconnected position are joined together with the aid of a second lead 7.

It is to be noted that, in terms of the same array substrate, it may only have the structure illustrated in FIG. 6 that disconnected places of a gate line 2 are joined by a first ITO lead 6, it may only have the structure illustrated in FIG. 9 that disconnected places of a data line 4 are joined by a second lead 7, and it may have the structure illustrated in FIG. 6 that disconnected places of a gate line 2 are joined by a first ITO lead 6, and have the structure illustrated in FIG. 9 that disconnected places of a data line 4 are joined by a second lead 7 besides.

In above embodiments, the gate line 2 may have a monolayered structure or a composite-layered structure constituted by one of aluminum, chromium, tungsten, tantalum, molybdenum and aluminum-nickel, or any combination thereof. The data line 4 may have a monolayered structure or a composite-layered structure constituted by one of aluminum, chromium, tungsten, tantalum, molybdenum and aluminum-nickel, or any combination thereof. Material for the gate insulating layer 3 may be silicon nitride, silicon dioxide, or aluminum oxide. Material for the passivation layer 5 may be silicon nitride, silicon dioxide or aluminum oxide. Material for the first lead 6 may be a conductive oxide, such as, indium tin oxide, indium zinc oxide or aluminum zinc oxide. Material for the second lead 7 may be a conductive oxide, such as, indium tin oxide, indium zinc oxide or aluminum zinc oxide.

Of course, it should be understood by those skilled in the art that, the array substrate further includes a gate electrode disposed in the same layer as the gate line 2, a source electrode and a drain electrode that are disposed in the same layer as the data line, a pixel electrode over the passivation layer and so on. In order to facilitate description of the array substrate according to embodiments of the invention, details are omitted here.

The embodiment of the invention has the following beneficial effects: a connecting lead formed of an inert material is provided in an adjacent layer of a gate line or/and a data line, and two ends of the gate line or/and data lines in a disconnected position are joined by the connecting lead, so as to avoid an issue that metal is easy to be corroded after the array substrate is cut.

According to an embodiment of the invention, there is provided a manufacturing method of an array substrate, which includes the following steps.

A first conductive thin film is formed on a substrate, so that a plurality of first leads and a plurality of common electrodes are formed through a patterning process.

A first metal thin film is formed, so that a gate electrode and a plurality of gate lines are formed through a patterning process. The gate lines are disconnected at a cut zone of the substrate, and are electrically joined by the lead wires.

A gate insulating layer is formed;

A second conductive thin film is formed, so that a plurality of second leads are formed through a patterning process;

A second metal thin film is formed, so that a source electrode, a drain electrode and a plurality of data lines are formed through a patterning process. The data lines are disconnected at a cut zone of the substrate, and are electrically joined by the second leads;

An active layer thin film is formed, so that an active layer is formed through a patterning process;

A passivation layer thin film is formed, so that a passivation layer is formed through a patterning process.

The embodiment of the invention has the following beneficial effects: a connecting lead formed of an inert material is provided in an adjacent layer of a gate line or/and a data line, and two ends of the gate line or/and data line in a disconnected position are joined by the connecting lead, so as to avoid an issue that metal is easy to be corroded after the array substrate is cut.

According to an embodiment of the invention, there is provided a manufacturing method of an array substrate, which includes the following steps.

A second conductive thin film is formed, so that a plurality of second leads and a plurality of pixel electrodes are formed through a patterning process.

A second metal thin film is formed, so that a source electrode, a drain electrode and a plurality of data lines are formed through a patterning process. The data lines are disconnected at a cut zone of the substrate, and are electrically joined by the second leads;

An active layer thin film is formed, so that an active layer is formed through a patterning process;

A gate insulating layer thin film is formed, so that a gate insulating layer is formed through a patterning process;

A first conductive thin film is formed, so that a plurality of first leads and a plurality of common electrodes are formed through a patterning process;

A first metal thin film is formed, so that a gate electrode and a plurality of gate lines are formed through a patterning process. The gate lines are disconnected at a cut zone of the substrate, and are electrically joined by the lead wires;

A passivation layer thin film is formed, so that a passivation layer is formed through a patterning process.

The patterning process in embodiments of the invention usually includes photoresist coating, exposure, development, etching, photoresist stripping and other process. Descriptions will be given with reference to an example in which a gate electrode and a plurality of gate lines are formed through a patterning process. A (positive) photoresist is coated on a first metal thin film so as to form a photoresist layer covering the first metal thin film; exposure is conducted on the photoresist layer with a mask; after development, the photoresist at the exposed zone is removed to thereby expose the first metal thin film, and the photoresist at the non-exposed zone is retained; the first metal thin film is etched, so that the first metal thin film at the exposed zone is etched off, and the first metal thin film at the non-exposed zone is not etched due to protection of the photoresist; the remaining photoresist is stripped, so as to form pattern of the gate electrode and the plurality of gate lines.

The embodiment of the invention has the following beneficial effects: a connecting lead formed of an inert material is provided in an adjacent layer of a gate line or/and a data line, and two ends of the gate line or/and data line in a disconnected position are joined by the connecting lead, so as to avoid an issue that metal is easy to be corroded after the array substrate is cut.

The array substrate in embodiments of the invention may serve as an array substrate for a TFT-LCD, may also be applied to an organic light emitting diode (OLED), an electronic paper or other display apparatus, and may also be applied to an X-ray detector or other electronic apparatus.

Descriptions made above are merely exemplary embodiments of the invention, but are not used to limit the protection scope of the invention.

This application claims the benefit of priority from Chinese patent application No. 201310701251.8, filed on Dec. 18, 2013, the disclosure of which is incorporated herein in its entirety by reference as a part of the present application.

The invention claimed is:

1. An array substrate, comprising:
a substrate;
a plurality of signal lines formed of a metal layer, which are disconnected at a cut zone of the substrate;
a plurality of connecting leads disposed in an adjacent layer of the signal lines, which correspond to locations of the signal lines where they are disconnected, and directly contact with the signal lines;
wherein, two ends of each of the signal lines in its disconnected position are electrically joined by the connecting leads, and
the signal lines include gate lines, the connecting leads include first leads;
wherein, the first leads are formed on the substrate, and the gate lines are located in an upper level than the first leads.

2. The array substrate according to claim 1, wherein, the signal lines further include data lines, the connecting leads further include second leads;
structure of the array substrate further includes a gate insulating layer, the second leads are formed on the gate insulating layer, and the data lines are located in an upper level than the second leads.

3. The array substrate according to claim 1, wherein, the signal lines include gate lines, the connecting leads include first leads;
structure of the array substrate further includes a gate insulating layer, the first leads are formed on the gate insulating layer, and the gate lines are located in an upper level than the first leads.

4. The array substrate according to claim 3, wherein, the signal lines further include data lines, the connecting leads further include second leads;
wherein, the second leads are formed on the substrate, the data lines are located in an upper level than the second leads, and the gate insulating layer is formed on the data lines.

5. The array substrate according to claim 1, wherein, it further includes a plurality of common electrodes, and the first leads and the common electrodes are provided on a same layer.

6. The array substrate according to claim 1, wherein, material for the connecting leads is a conductive oxide.

7. The array substrate according to claim 6, wherein, material for the connecting leads is indium tin oxide, indium zinc oxide or aluminum zinc oxide.

8. The array substrate according to claim 3, wherein, it further includes a plurality of common electrodes, and the first leads and the common electrodes are provided on a same layer.

* * * * *